(12) United States Patent
Fuselier et al.

(10) Patent No.: US 6,737,332 B1
(45) Date of Patent: May 18, 2004

(54) SEMICONDUCTOR DEVICE FORMED OVER A MULTIPLE THICKNESS BURIED OXIDE LAYER, AND METHODS OF MAKING SAME

(75) Inventors: Mark B. Fuselier, Austin, TX (US); Derick J. Wristers, Bee Caves, TX (US); Andy C. Wei, Radebeul/Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/109,096

(22) Filed: Mar. 28, 2002

(51) Int. Cl.[7] .................. H01L 21/20; H01L 21/265
(52) U.S. Cl. .............. 438/423; 438/479; 438/480; 438/517; 438/526; 438/527
(58) Field of Search ................ 438/407, 423, 438/526, 528, 219, 295, 404, 405, 479, 480, 517; 257/347

(56) References Cited

U.S. PATENT DOCUMENTS

| | | | |
|---|---|---|---|
| 5,950,094 A | 9/1999 | Lin et al. ............. | 438/409 |
| 6,069,054 A | * 5/2000 | Choi ................. | 438/423 |
| 6,180,487 B1 | * 1/2001 | Lin .................. | 438/407 |
| 6,204,546 B1 | 3/2001 | Roitman et al. ........ | 257/506 |
| 6,531,375 B1 | * 3/2003 | Giewont et al. ........ | 438/407 |

FOREIGN PATENT DOCUMENTS

| | | | |
|---|---|---|---|
| EP | 0 687 002 A2 | 12/1995 | ...... H01L/21/762 |
| WO | WO 00/48245 | 8/2000 | ...... H01L/21/762 |

\* cited by examiner

*Primary Examiner*—Donghee Kang
(74) *Attorney, Agent, or Firm*—Williams, Morgan & Amerson, P.C.

(57) ABSTRACT

The present invention is generally directed to a semiconductor device formed over a multiple thickness buried oxide layer, and various methods of making same. In one illustrative embodiment, the device comprises a bulk substrate, a multiple thickness buried oxide layer formed above the bulk substrate, and an active layer formed above the multiple thickness buried oxide layer, the semiconductor device being formed in the active layer above the multiple thickness buried oxide layer. In some embodiments, the multiple thickness buried oxide layer is comprised of a first section positioned between two second sections, the first section having a thickness that is less than the thickness of the second sections. In one illustrative embodiment, the method comprises performing a first oxygen ion implant process on a silicon substrate, forming a masking layer above the substrate, performing a second oxygen ion implant process on the substrate through the masking layer, and performing at least one heating process on the substrate to form a multiple thickness buried oxide layer in the substrate. In another illustrative embodiment, the method comprises performing a first oxygen ion implant process on a silicon substrate, forming a masking layer above the substrate, performing a second oxygen ion implant process on the substrate through the masking layer, and performing at least one heating process on the substrate to form a multiple thickness buried oxide layer in the substrate. In yet another illustrative embodiment, the method comprises forming a multiple thickness buried oxide layer using a wafer bonding technique.

6 Claims, 5 Drawing Sheets

SEMICONDUCTOR DEVICE FORMED OVER A MULTIPLE THICKNESS BURIED OXIDE LAYER, AND METHODS OF MAKING SAME

BACKGROUND OF THE INVENTION

1. Field of the Invention

This invention relates generally to semiconductor fabrication technology, and, more particularly, to a semiconductor device formed over a multiple thickness buried oxide layer, and methods of making same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As transistors are continually scaled in keeping with the requirements of advancing technology, device reliability dictates a concomitant reduction in the power supply voltage. Hence, every successive technology generation is often accompanied by a reduction in the operating voltage of the transistor. It is known that transistor devices fabricated on silicon-on-insulator (SOI) substrates exhibit better performance at low operating voltages than do transistors of similar dimensions fabricated in bulk silicon substrates. The superior performance of SOI devices at low operating voltage is related to the relatively lower junction capacitances obtained on an SOI device compared to a bulk silicon device of similar dimensions. The buried oxide layer in an SOI device separates active transistor regions from the bulk silicon substrate, thus reducing junction capacitance.

Transistors fabricated in SOI substrates offer several performance advantages over transistors fabricated in bulk silicon substrates. For example, complementary-metal-oxide-semiconductor (CMOS) devices fabricated in SOI substrates are not prone to disabling capacitive coupling, known as latch-up. In addition, transistors fabricated in SOI substrates, in general, have large drive currents and high transconductance values. Also, the sub-micron SOI transistors have improved immunity to short-channel effects when compared with bulk transistors fabricated to similar dimensions.

Although SOI devices offer performance advantages over bulk silicon devices of similar dimensions, SOI devices share certain performance problems common to all thin-film transistors. For example, the active elements of an SOI transistor are fabricated in a thin-film active layer. Scaling of thin-film transistors to smaller dimensions requires that the thickness of the active layer be reduced. However, as the thickness of the active layer is reduced, the electrical resistance of the active layer correspondingly increases. This can have a negative impact on transistor performance because the fabrication of transistor elements in a conductive body having a high electrical resistance reduces the drive current of the transistor. Moreover, as the thickness of the active layer of an SOI device continues to decrease, variations in the threshold voltage ($V_T$) of the device occur. In short, as the thickness of the active layer decreases, the threshold voltage of the device becomes unstable. As a result, use of such unstable devices in modern integrated circuit devices, e.g., microprocessors, memory devices, logic devices, etc., becomes very difficult if not impossible.

The present invention is directed to a device and various methods that may solve, or at least reduce, some or all of the aforementioned problems.

SUMMARY OF THE INVENTION

The present invention is generally directed to a semiconductor device formed over a multiple thickness buried oxide layer, and various methods of making same. In one illustrative embodiment, the device comprises a bulk substrate, a multiple thickness buried oxide layer formed above the bulk substrate, and an active layer formed above the multiple thickness buried oxide layer, the semiconductor device being formed in the active layer above the multiple thickness buried oxide layer. In a more particular embodiment, the multiple thickness buried oxide layer further comprises a first section positioned between two second sections, the first section having a thickness that is less than the thickness of the second sections.

In one illustrative embodiment, the method comprises performing a first oxygen ion implant process on a silicon substrate, forming a masking layer above the substrate after the first oxygen implant process, performing a second oxygen ion implant process on the substrate through the masking layer, and performing at least one heating process on the substrate to form a multiple thickness buried oxide layer in the substrate. In another illustrative embodiment, the method comprises forming a masking layer above the substrate, performing a first oxygen ion implant process on a silicon substrate through the masking layer, removing the masking layer, performing a second oxygen ion implant process on the substrate after the masking layer is removed, and performing at least one heating process on the substrate to form a multiple thickness buried oxide layer in the substrate.

In yet another illustrative embodiment, the method comprises forming a layer of silicon dioxide above a first substrate, forming a masking layer above a portion of the layer of silicon dioxide, performing at least one etching process to etch a recess in the substrate adjacent each side of the masking layer, and removing the masking layer. The method further comprises performing at least one of an oxidation process and a deposition process to form silicon dioxide in at least the recesses, performing at least one chemical mechanical polishing operation on at least the silicon dioxide formed in the recesses, bonding a second substrate to at least the silicon dioxide formed in the recesses, and removing a portion of the second substrate.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
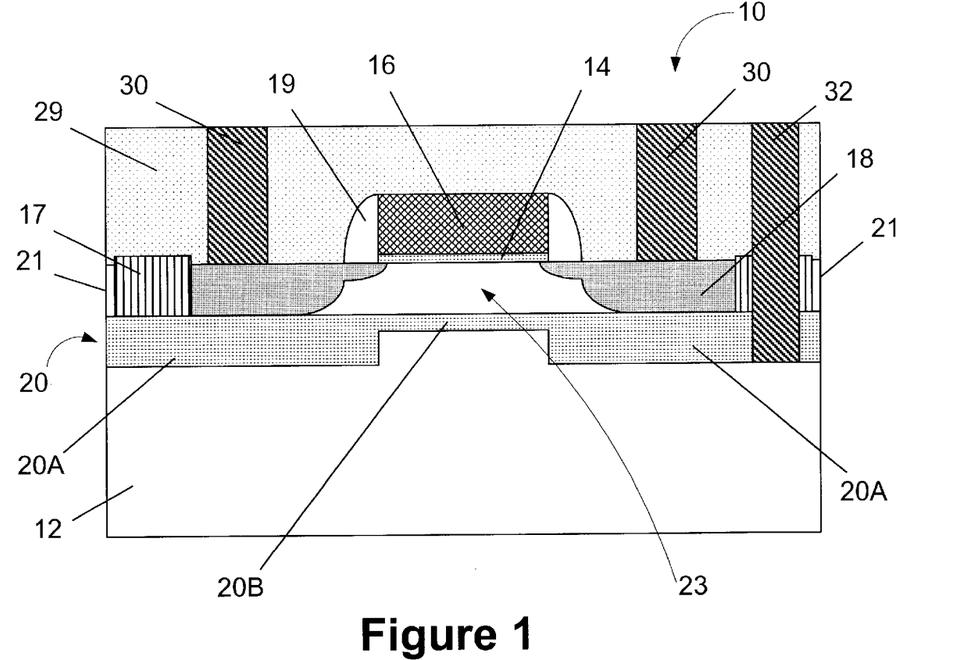
FIG. 1 is a cross-sectional view of an illustrative semiconductor device in accordance with one illustrative embodiment of the present invention.

In general, the present invention is directed to a semiconductor device formed over a buried oxide layer having sections of differing thicknesses, and various methods of making same. FIG. 1 is a cross-sectional view of a semiconductor device 10 in accordance with one illustrative embodiment of the present invention. Although the present invention will be disclosed in the context of the formation of an illustrative NMOS transistor, those skilled in the art will understand after a complete reading of the present application that the present invention is not so limited. More particularly, the present invention may be employed with respect to a variety of technologies, e.g., NMOS, PMOS, CMOS, etc., and it may be employed with a variety of different type devices, e.g., memory devices, microprocessors, logic devices, etc.

As shown in FIG. 1, the semiconductor device 10 is formed above a silicon-on-insulator (SOI) type structure comprised of a bulk substrate 12, a buried oxide layer (BOX) 20, and an active layer 21. The buried oxide layer 20 has a varying thickness, as indicated by relatively thick buried oxide sections 20A positioned adjacent a relatively thin buried oxide section 20B. Of course, FIG. 1 only depicts a small portion of an entire substrate or wafer. As a result, the buried oxide layer 20 will have many thousands of thin sections 20B spread across the entirety of the wafer. The SOI structure depicted in FIG. 1 may be formed by various techniques to be described in further detail later in the application.

In the illustrative embodiment where an NMOS device is formed, the bulk substrate 12 may be doped with a P-type dopant material, e.g., boron, boron difluoride, etc. The thick sections 20A of the buried oxide layer 20 may have a thickness that, in one embodiment, varies from approximately 120–180 nm (1200–1800 Å), whereas the thickness of the thin section 20B of the buried oxide layer 20 may vary from approximately 30–50 nm (300–500 Å).

The active layer 21 may have a thickness that varies from approximately 5–30 nm (50–300 Å), and, in the case of an NMOS device, it may be doped with a P-type dopant material.

The semiconductor device 10 further comprises a gate insulation layer 14, a gate electrode 16, sidewall spacers 19, and a plurality of source/drain regions 18 formed in the active layer 21. Trench isolations regions 17 are formed in the active layer 21 to electronically isolate the semiconductor device 10 from other semiconductor devices (not shown). Also depicted in FIG. 1 are a plurality of conductive contacts 30 that are formed in a layer of insulating material 29, e.g., silicon dioxide. The conductive contacts 30 provide the necessary electrical connections to the source/drain regions 18 of the device 10. Also depicted in FIG. 1 is a contact 32 that is used to produce electrical connection to the substrate 12. Note that the thin section 20B of the buried oxide layer 20 is positioned under the channel region 23 of the semiconductor device 10. For example, in the depicted embodiment, the thin section 20B is approximately aligned with the gate electrode 16 of the semiconductor device 10.

The semiconductor device 10 and its various components, e.g., gate electrode 16, gate insulation layer 14, source/drain regions 18, sidewall spacers 19, trench isolation regions 17, and contacts 30 may all be formed using traditional techniques for forming such components. For example, the gate insulation layer 14 may be comprised of silicon dioxide, the gate electrode 16 may be comprised of a doped polysilicon, and the source/drain regions 18 may be formed by performing a relatively low-dose extension implant process followed by a relatively high-dose source/drain implant process. Thus, the particular techniques and materials used for forming the various components of the semiconductor device 10 depicted in FIG. 1 should not be considered a limitation of the present invention unless such limitations are clearly set forth in the appended claims.

Figure 2A:
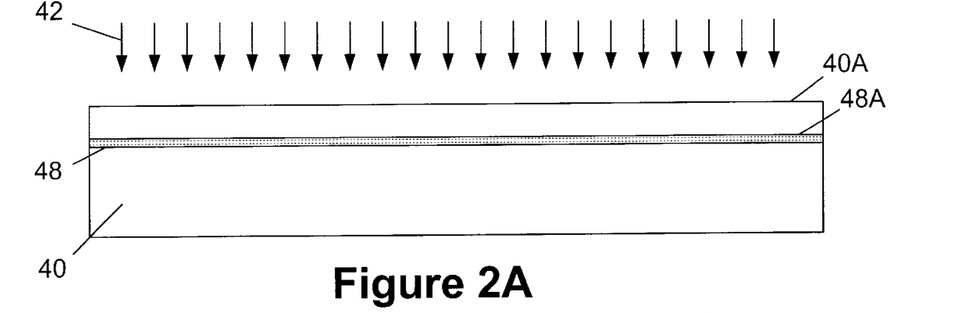
FIGS. 2A–2D are various cross-sectional views depicting one illustrative method for forming portions of the semiconductor device of the present invention.

The multiple thickness buried oxide layer 20 depicted in FIG. 1 may be formed by a variety of techniques. FIGS. 2A–2D depict various methods that employ oxygen implant techniques as part of the process of forming the buried oxide layer 20. For example, as shown in FIG. 2A, an initial oxygen ion implant process, as indicated by arrows 42, may be performed on a wafer 40 to form a relatively thin oxygen implant layer 48 in the substrate 40. In one illustrative embodiment, the oxygen implant process 42 may be performed using an oxygen dose ranging from approximately $10^{17}$–$10^{18}$ ions/cm$^2$ at an energy level ranging from approximately 10–40 keV. As a result, the oxygen implant layer 48 may have a thickness of approximately 20–70 nm (200–700 Å) and its upper surface 48A may be positioned approximately 10–70 nm (100–700 Å) beneath the surface 40A of the substrate 40. If desired, the oxygen implant process may be performed at an elevated temperature, e.g., 400–700° C.

Figure 2B:
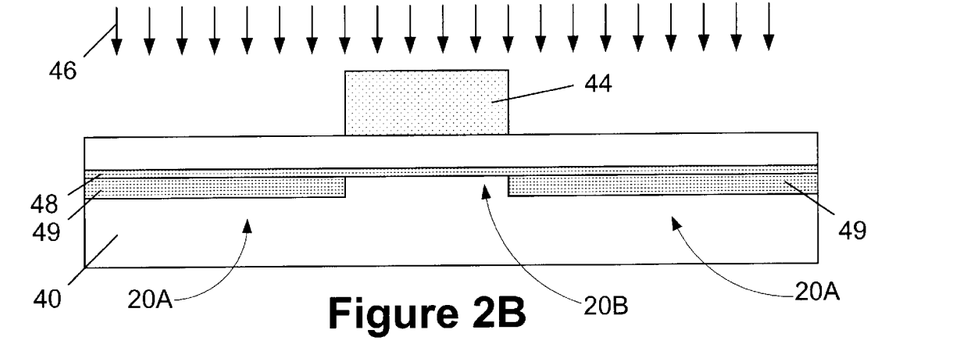

Thereafter, as shown in FIG. 2B, a masking layer 44 is formed above the substrate 40. The masking layer 44 may employ a variety of materials, e.g., photoresist. In some cases, the masking layer 44 may actually be a gate electrode 16 of what will become the finished semiconductor device 10. After the masking layer 44 is formed, a second oxygen implant process, as indicated by arrows 46, is performed to form relatively thick oxygen implant layers 49 in the substrate 40. At some point later during the process of forming the semiconductor device 10, one or more anneal processes will be performed at a temperature ranging from approximately 950–1150° C. to covert the oxygen implant layers 48, 49 into silicon dioxide, thereby forming the sections 20A, 20B of the multiple thickness buried oxide layer 20. The second implant process 46 may be performed at an energy level of approximately 30–150 keV with a dopant dose of approximately $10^{17}$–$10^{18}$ ions/cm$^2$.

Figure 2C:
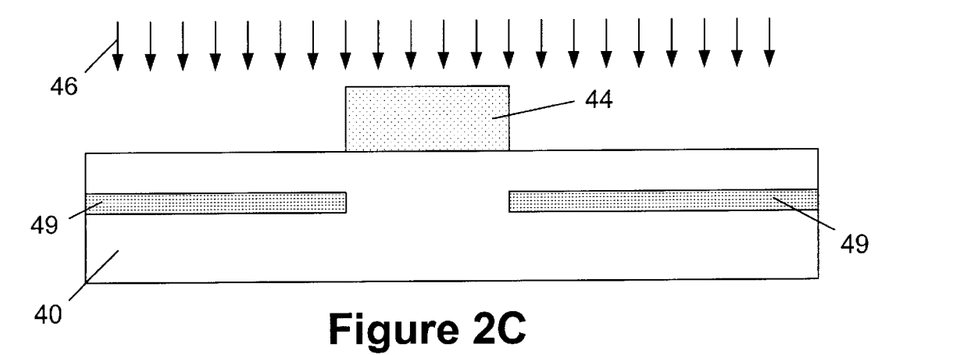
Figure 2D:
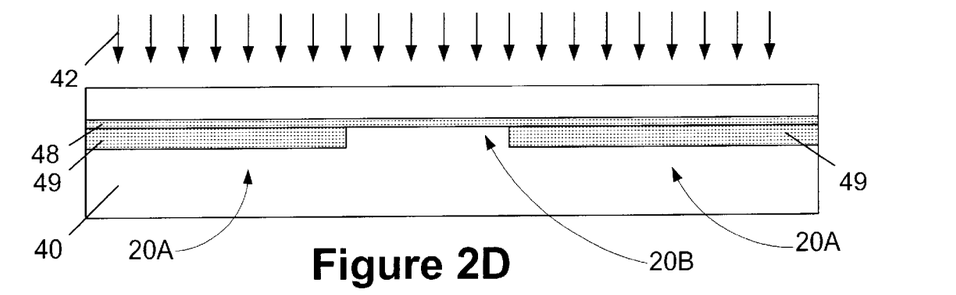

FIGS. 2C and 2D depict an alternative embodiment where the ion implant process 42 and 46 are performed in a different order. In this embodiment, the masking layer 44 is initially formed above the substrate 40. Thereafter, the oxygen ion implant process 46 is performed to form relatively thick oxygen implant regions 49 in the substrate 40. Thereafter, the masking layer 44 is removed, and the oxygen implant process 42 is performed to form the relatively thin oxygen implant region 48. As before, one or more anneal processes may be subsequently performed to convert the implanted oxygen layers 48, 49 to the buried oxide layer 20 comprised of relatively thick sections 20A and relatively thin sections 20B, as depicted in FIG. 1.

Figure 3A:
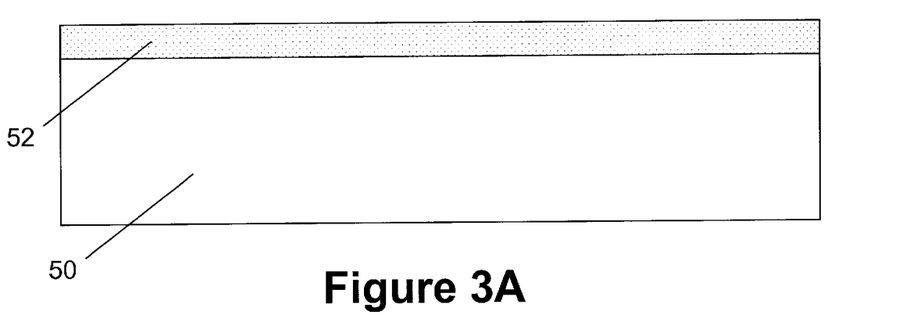
FIGS. 3A–3F depict another illustrative embodiment of a method of forming the device disclosed herein.
Figure 3B:
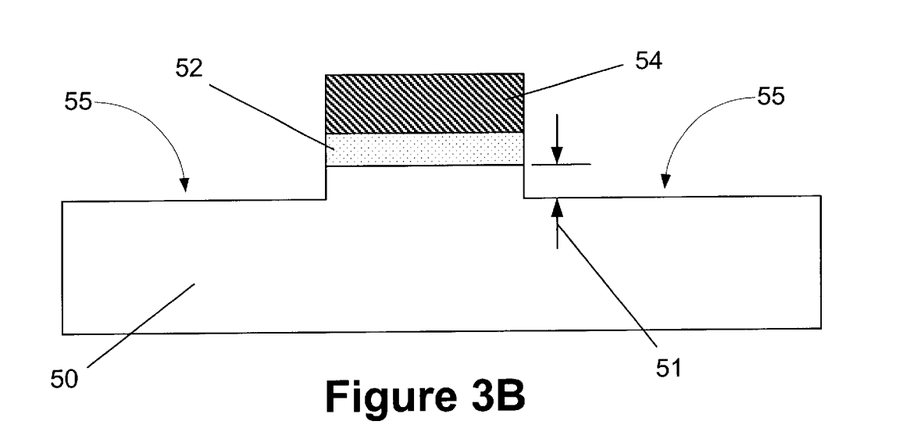
Figure 3C:
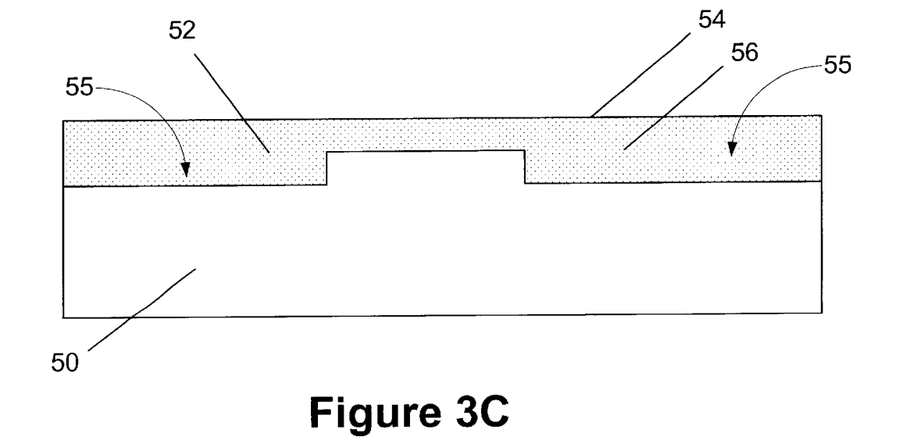

FIGS. 3A–3E depict a wafer-bonding technique for formation of the multiple thickness buried oxide layer 20 depicted in FIG. 1. As shown in FIG. 3A, a traditional oxidation process is performed to form a relatively thin layer of silicon dioxide 52 on a silicon wafer 50. The layer of silicon dioxide 52 may have a thickness ranging from approximately 30–70 nm (300–700 Å). Thereafter, as shown in FIG. 3B, a masking layer 54 is formed above the silicon dioxide layer 52, and an etching process is performed to form recesses 55 in the wafer 50. In one illustrative embodiment, the recesses 55 may have depths of approximately 10–50 nm (100–500 Å), and this depth may vary depending upon the desired final thickness of the thick sections 20A of the multiple thickness buried oxide layer 20 depicted in FIG. 1.

Figure 3D:
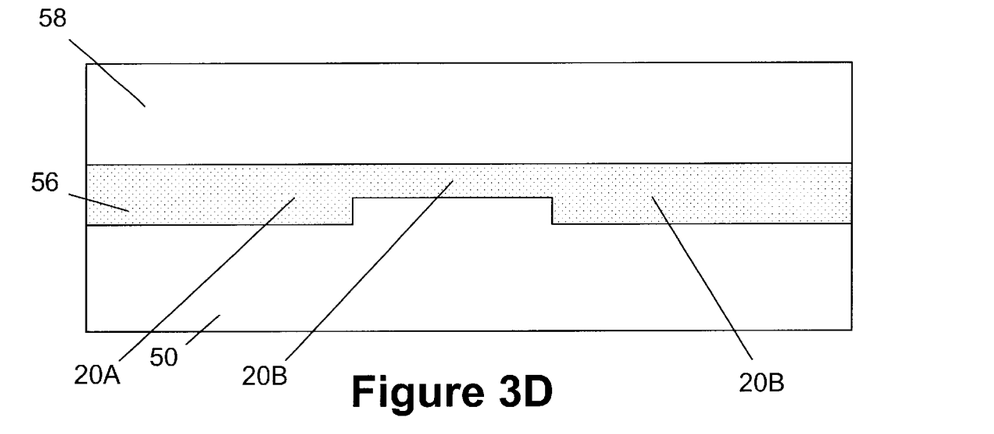
Figure 3E:
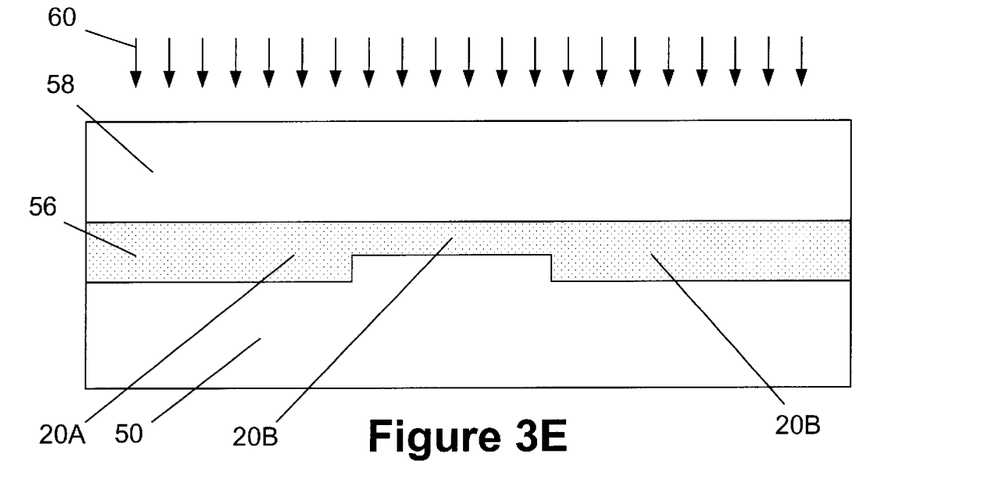
Figure 3F:
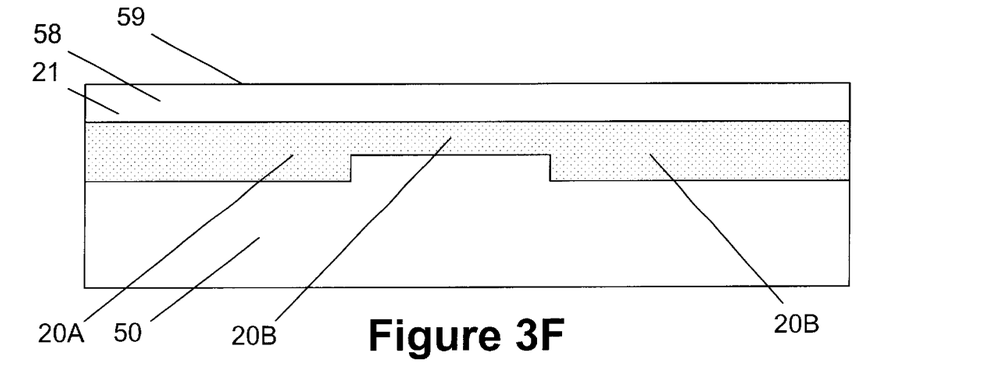

Next, the masking layer 54 is removed and a second oxidation process or a deposition process is used to form silicon dioxide in the recesses 55 in the wafer 50. Thereafter, a chemical mechanical polishing operation is performed to reduce the thickness of the silicon dioxide to a desired level. These processes result in the formation of the stepped oxide layer 56 depicted in FIG. 3C. Then, as shown in FIG. 3D, traditional bonding techniques are employed to bond a second wafer 58 to the stepped oxide layer 56. Traditional "smart cut" processing may then be employed to complete the formation of the desired SOI structure. More particularly, as indicated in FIG. 3E, a hydrogen implant process, as indicated by arrows 60, is performed and the bulk of the wafer 58 is removed. Then, a chemical mechanical polish process is performed on the surface 59 of the remaining portion of the wafer 58 to result in the final desired SOI structure with a buried oxide layer 20 comprised of thick sections 20A and a thin section 20B having an active layer 21 formed thereabove.

Figure 4A:
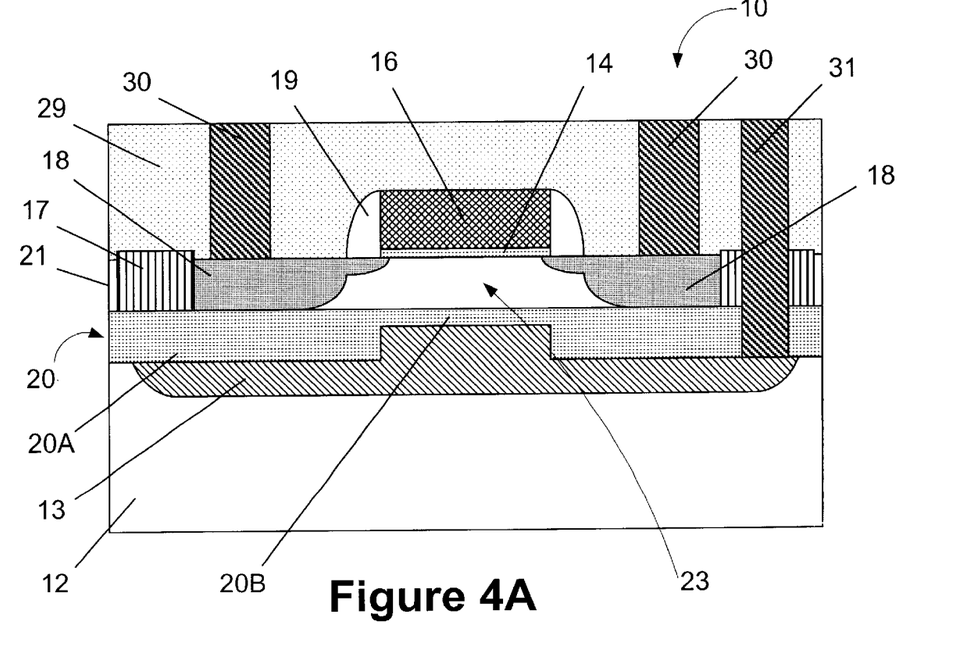
FIGS. 4A–4C depict yet another illustrative embodiment of an illustrative semiconductor device in accordance with yet another illustrative embodiment of the present invention.

In a further embodiment of the present invention, as depicted in FIG. 4A, a doped back gate region 13 may be formed in the bulk substrate 12. In one illustrative embodiment, portions of the back gate region 13 are formed under the multiple thickness buried oxide layer 20. The back gate region 13 may be doped with a dopant material that is of the same type as the dopant type used to dope the channel region 23 of the semiconductor device 10. For example, for an NMOS device, the back gate region 13 may be doped with a P-type dopant material. For a PMOS device, the back gate region 13 may be doped with an N-type dopant material. Of course, as will be recognized by those skilled in the art after a complete reading of the present application, aspects of the present invention may be employed in semiconductor devices without forming the back gate region 13, e.g., as in the semiconductor device 10 depicted in FIG. 1. A contact 31 may be provided to provide electrical contact to the back gate region 13.

Figure 4B:
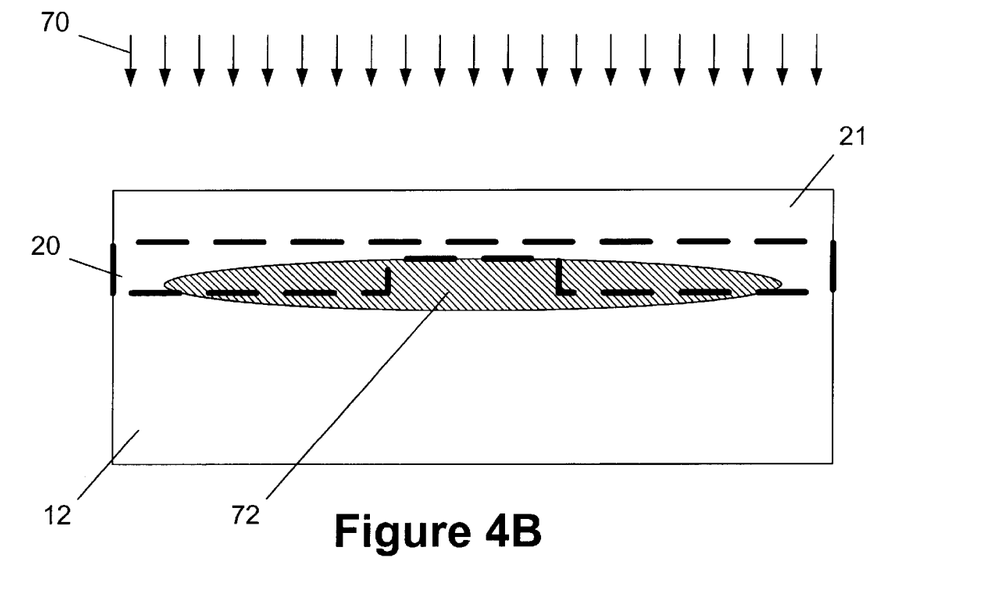
Figure 4C:
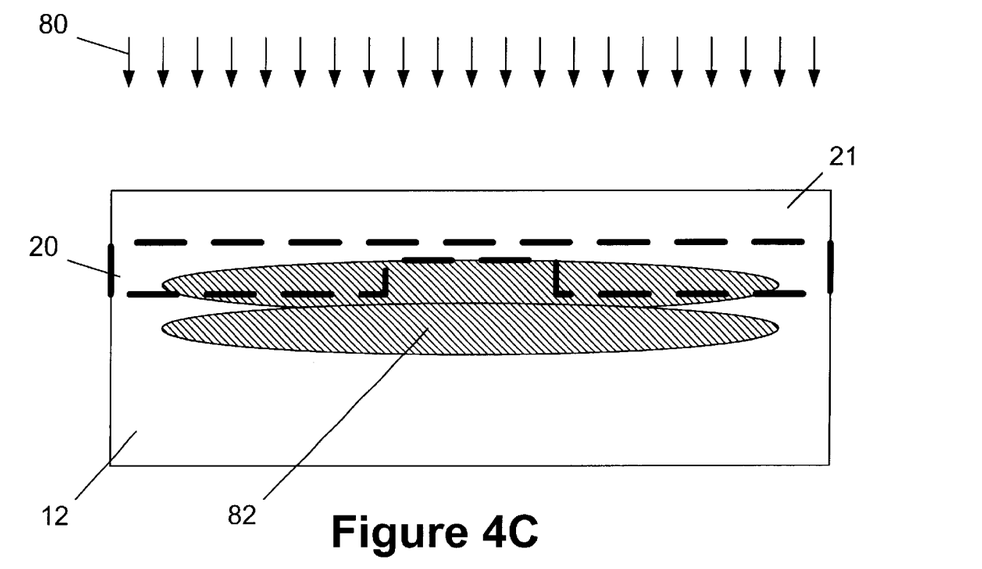

In situations in which the back gate region 13 is formed, it may be formed by performing a single or multiple ion implant processes. For example, in the case of an NMOS device, an initial ion implant process may be performed, as indicated by arrows 70 in FIG. 4B, to form an implant region 72 in the substrate 12. For purposes of clarity, the multiple thickness buried oxide layer 20 is indicated by heavy dashed lines in FIGS. 4B–4C. The initial implant process 70 may be performed using arsenic and a dopant dose of approximately $10^{15}$–$10^{16}$ ions/cm$^2$ and at an energy level of approximately 50–80 keV. Thereafter, as indicated in FIG. 4C, a second ion implant process, as indicated by arrows 80 may be performed to form implant regions 82 in the substrate 12. In one illustrative embodiment, the implant process 80 may be performed using arsenic at a dopant dose level of approximately $10^{15}$–$10^{16}$ ions/cm$^2$ and at an energy level of approximately 50–200 keV. After the implant processes 70, 80 are performed, one or more anneal processes are performed to repair the damaged lattice structure of the silicon substrate and to drive the implanted dopant material to the final position of the back gate region 13 depicted in FIG. 4A.

The present invention is generally directed to a semiconductor device formed over a multiple thickness buried oxide layer, and various methods of making same. In one illustrative embodiment, the device comprises a bulk substrate, a multiple thickness buried oxide layer formed above the bulk substrate, and an active layer formed above the multiple thickness buried oxide layer, the semiconductor device being formed in the active layer above the multiple thickness buried oxide layer. In further embodiments, the multiple thickness buried oxide layer further comprises a first section positioned between two second sections, the first section having a thickness that is less than the thickness of the second sections.

In one illustrative embodiment, the method comprises performing a first oxygen ion implant process on a silicon substrate, forming a masking layer above the substrate after the first oxygen ion implant process, performing a second oxygen ion implant process on the substrate through the masking layer, and performing at least one heating process on the substrate to form a multiple thickness buried oxide layer in the substrate. In another illustrative embodiment, the method comprises forming a masking layer above the substrate, performing a first oxygen ion implant process on a silicon substrate through the masking layer, removing the masking layer, performing a second oxygen ion implant process on the substrate after the masking layer is removed, and performing at least one heating process on the substrate to form a multiple thickness buried oxide layer in the substrate. In yet another illustrative embodiment, the method comprises forming a layer of silicon dioxide above a first substrate, forming a masking layer above a portion of the layer of silicon dioxide, performing at least one etching process to etch a recess in the substrate adjacent each side of the masking layer, and removing the masking layer. The method further comprises performing at least one of an oxidation process and a deposition process to form silicon dioxide in at least the recesses, performing at least one chemical mechanical polishing operation on at least the silicon dioxide formed in the recesses, bonding a second substrate to at least the silicon dioxide formed in the recesses, and removing a portion of the second substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, comprising:
    performing a first oxygen ion implant process on a silicon substrate;
    forming a masking layer comprised of a gate electrode structure above said substrate after said first oxygen ion implant process;
    performing a second oxygen ion implant process on said substrate while using at least said gate electrode as a masking layer; and
    performing at least one heating process on said substrate to form a multiple thickness buried oxide layer in said substrate.

2. The method of claim 1, further comprising forming source/drain regions device above said multiple thickness buried oxide layer.

3. The method of claim 1, wherein said first oxygen ion implant process is performed at an energy level ranging from approximately 10–40 keV and using an oxygen dopant dose ranging from approximately $10^{17}$–$10^{18}$ ions/cm$^2$.

4. The method of claim 1, wherein said second oxygen ion implant process is performed at an energy level ranging from approximately 30–150 keV and using an oxygen dopant dose ranging from approximately $10^{17}$–$10^{18}$ ions/cm$^2$.

5. The method of claim 1, wherein performing at least one heating process comprises performing at least one heating process at a temperature ranging from approximately 950–1150° C.

6. The method of claim 1, wherein said multiple thickness buried oxide layer comprises:
    a first section positioned between two second sections, said first section having a thickness and each of said second sections having a thickness, said thickness of said first section being less than said thickness of said second sections.

* * * * *

UNITED STATES PATENT AND TRADEMARK OFFICE
CERTIFICATE OF CORRECTION

PATENT NO. : 6,737,332 B1
DATED : May 18, 2004
INVENTOR(S) : Mark B. Fuselier, Derick J. Wristers and Andy C. Wei It is certified that error appears in the above-identified patent and that said Letters Patent is hereby corrected as shown below:

Column 8,
Line 16, after "regions" delete "device"

Signed and Sealed this

Sixth Day of July, 2004

JON W. DUDAS
*Acting Director of the United States Patent and Trademark Office*